United States Patent
Castelli et al.

(10) Patent No.: US 6,339,315 B1
(45) Date of Patent: Jan. 15, 2002

(54) MEASURING COUNTER OF THE STATE OF CHARGE OF THE POWERING BATTERY OF AN ELECTRONIC APPLIANCE

(75) Inventors: Claudia Castelli, Brugherio; Fabrizio Fraternali, Vercelli; Adalberto Mariani, Garlasco; Alex Pojer, Cassinetta di Biandronno, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/503,652

(22) Filed: Feb. 14, 2000

(30) Foreign Application Priority Data

Feb. 18, 1999 (EP) ............................. 99830086

(51) Int. Cl.$^7$ ................................................ H02J 7/00
(52) U.S. Cl. ...................................... 320/136; 324/428
(58) Field of Search ................................. 320/136, 106, 320/118; 324/428, 429, 430; 340/636

(56) References Cited

U.S. PATENT DOCUMENTS

| | | | | |
|---|---|---|---|---|
| 5,124,627 A | * | 6/1992 | Okada | 320/136 |
| 5,144,218 A | * | 9/1992 | Bosscha | 320/134 |
| 5,424,722 A | * | 6/1995 | Inada et al. | 340/635 |
| 5,432,429 A | | 7/1995 | Armstrong, II et al. | 320/136 |
| 5,594,345 A | * | 1/1997 | Boehm | 324/428 |
| 5,614,902 A | | 3/1997 | Hopkins | 341/118 |
| 6,018,228 A | * | 10/1998 | Dias et al. | 320/106 |
| 6,049,210 A | * | 4/2000 | Hwang | 320/134 |

FOREIGN PATENT DOCUMENTS

| | | |
|---|---|---|
| DE | 41 03 470 A1 | 8/1991 |
| GB | 2 231 714 A | 1/1998 |
| NL | 0248461 | * 10/1990 |
| NL | 0425044 | * 10/1990 |

* cited by examiner

*Primary Examiner*—Peter S. Wong
*Assistant Examiner*—Pia Tibbits
(74) *Attorney, Agent, or Firm*—Lisa K. Jorgenson; Allen, Dyer, Doppelt, Milbrath & Gilchrist, P.A.

(57) ABSTRACT

A charge counter for monitoring the charge of the battery state of an electronic device includes a sensing circuit of the charge and discharge current of the battery. The sensing circuit includes a differential amplifier having inputs coupled to the terminals of a sensing resistor of the battery current, a resettable integrator of the output signal of the amplifier, a first comparator and a second comparator of the output signal of the integrator generating a logic charge interrupt signal and a logic discharge interrupt signal, respectively. The sensing circuit also includes a switch for discharging the capacitance of the integrator momentarily closed by a logic circuit at every transition of the output signal of one or the other of the first and second comparators. Further, the sensing circuit includes a processor for the interrupts which monitors the state of charge of the battery, a timer for measuring the time elapsing from the start of a new integration ramp and the switching instant of either one of the first and second comparators, and a nonvolatile memory register containing the measure of the time interval of integration of the offset of the differential amplifier up to the switching of either of the first and second comparators.

10 Claims, 1 Drawing Sheet

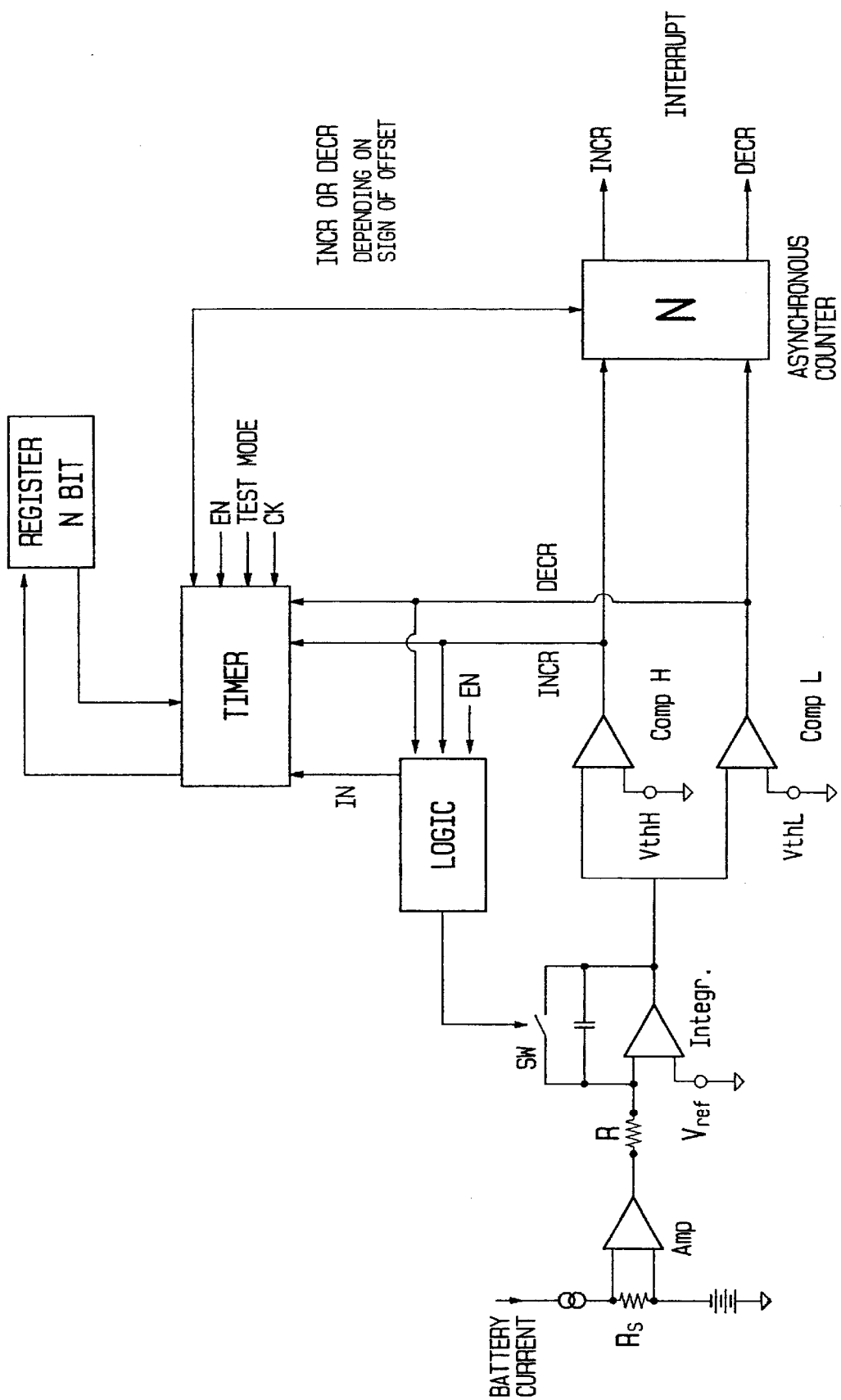

MEASURING COUNTER OF THE STATE OF CHARGE OF THE POWERING BATTERY OF AN ELECTRONIC APPLIANCE

FIELD OF THE INVENTION

The present invention relates to systems for managing power dissipation of electronic devices powered with rechargeable batteries and, more particularly to a system which indicates the state of charge of the battery, for example on an LCD monitor.

BACKGROUND OF THE INVENTION

In many familiar portable electronic devices such as mobile telephones, personal computers and the like, it is important to know the charge condition of the batteries. This function is commonly carried out by the use of a specific integrated system having a charge counter (Coulomb Counter or CC) which monitors the electric charge that flows in and out of battery. The system generates a logic interrupt signal every time a certain amount of electric charge crosses the battery, during the charge phase (charge interrupt INCR) as well as during the discharge phase, that is, of powering of the portable device (discharge interrupt DECR).

These interrupts are algebraically processed by the micro controller of the portable device that obtains an indication of the state of charge of the battery. This information is either displayed on the screen in the form, for example, of an icon with different brightness grades or as a numerical indication of the percentage of charge of the battery or the like.

In order to evaluate the amount of available charge that flows through the battery, the battery current is commonly monitored on a dedicated sensing resistor, connected electrically in series with the battery. The voltage drop on this resistor is amplified through a differential amplifier whose output signal is integrated through a dedicated integrator stage. In the presence of an electric current flowing through the battery, a positive or negative ramp is produced at the output of the integrating stage, depending on the current direction (either a charge current or a discharge current).

The ramp is interrupted by the switching of one or the other of a pair of comparators, one for the positive ramp and the other for the negative ramp, which momentarily closes a discharge switch of the capacitance of integration and thereafter a new ramp begins and so forth. Therefore, the switchings of the two comparators generate as many interrupt signals, of one or the other sign, that are fed to two respective counters, or to a unique counter which is incremented by a unit at each charge interrupt or decremented by a unit at every discharge interrupt or vice versa. In either case, the content of the counters or of the reversible counter indicates the state of charge of the battery.

The quest for minimizing power dissipation encourages the use of a sensing resistor of the battery current of a very small value, typically on the order of few tens of a mΩ (for example 50 to 100 mΩ). The monitoring of the battery current is to some extent invalidated by the offset of the differential amplifier. Indeed, the amplifier offset sums itself to the voltage drop on the terminals of the sensing resistor and when the battery current is relatively low, for example less than a few tens of mΩ, the offset of the amplifier may be of the same order of the real signal. Moreover, during null battery current working conditions, the system will continue to integrate the offset, and the counter would be periodically increased or decreased depending on the sign of the offset, and in absence of specific corrections, thus providing the micro-controller with erroneous information.

In order to avoid this error, a minimum current level is usually established, below which the monitoring of the current is inhibited, thus creating, in practice, a so-called dead zone, typically in the order of few mA. When the signal level is lower than a certain threshold corresponding to such a set minimum current level of the dead zone, the output signal of the amplifier in not integrated, thus averting the generation of interrupt under conditions that would be grossly affected by the offset.

It is quite difficult to precisely define the limits of this dead zone and the computational error of the charge state is rather relevant.

SUMMARY OF THE INVENTION

Confronted with the difficulties and limitations of the conventional approaches, an object of the invention is to provide a charge counter that allows, according to preferred embodiment, a substantially complete compensation of the offset by carrying out a trimming step of the system. An alternative object of the invention is to provide a counter in which the limits of an appropriate dead zone may be accurately defined by carrying out a trimming step.

Substantially, the system of the invention is based on the use of a timer that measures the time interval between the start instant of an integration ramp of the output signal of the differential amplifier that monitors the current through the battery and the switching of one or the other comparator. Also, the invention is based on the use of a nonvolatile memory register to permanently store the time interval relative to the integration of the offset established during a trimming step, done by short-circuiting the inputs of the differential amplifier that monitors the current battery. Of course, the offset direction is also permanently stored in the memory register as a sign bit.

According to a preferred embodiment of the invention, during a null battery current phase, the system continues to integrate the amplifier offset causing the switching of the relative comparator which, if not compensated for, would unduly increment the relative interrupt counter. However, at the expiration of the pre-established time interval, the value of which is permanently stored in the register during a trimming step, the relative interrupt counter is decremented by a unit, thus nullifying the increment due a continued integration of the offset. In presence of a battery current, the offset is integrated together with the signal present on the sensing resistor terminals, and also in these conditions, when the pre-established and permanently stored time interval lapses, the system decrements the relative interrupt counter by a unit, thus thoroughly compensating any offset effect in computing the interrupts under any current absorption condition.

If desired, the system of the invention may also be used to implement an interrupt counter with a dead zone, the extent of which may be defined according to the real offset conditions with a high accuracy. Assuming it is desired to set a dead zone between ±15 mA, during a dedicated trimming step, a current of 15 mA is forced through the sensing resistor. The timer measures the time interval (dead zone time) elapsing from the beginning of the integration and the eventual switching of the relative comparator. This information is permanently stored in the nonvolatile memory register.

During the normal functioning of the device, the timer, at the beginning of each new integration phase counts backward starting from the dead zone limit time. Therefore, if the battery current is within the dead zone range, the integration time will be greater (or at the most equal to) than the dead zone limit time and the result of the counting will be null, thus impeding an increment of the relative interrupt counter. If the battery current is greater than the dead zone limit current, the integration time needed to trigger the relative interrupt counter will be less than the dead zone limit time and the result of the counting will be different from zero. Therefore, the interrupt counter will be correctly increased or decreased upon the switching of the relative comparator.

BRIEF DESCRIPTION OF THE DRAWING

The attached FIGURE schematically illustrates a counter according to the invention.

DETAILED DESCRIPTION OF THE PREFERRED EMBODIMENTS

By referring to the FIGURE, the counter of the invention for determining the state of charge of a battery, comprises a conventional sensing circuit of the charge and discharge current of the battery. The summing circuit is composed of a differential amplifier AMP whose inputs are coupled to the terminals of a sensing resistor Rs of the battery current, and of an integrator stage INTEGR, resettable by a switch SW, that integrates the signal output by the amplifier AMP. A first comparator CompH compares the ramp output by the integrator with a first threshold VthH, eventually generating a logic charge interrupt signal INCR, while a second comparator CompL compares the same signal output by the integrator with a second threshold VthL, eventually generating a logic discharge interrupt signal DECR.

The discharge switch SW of the capacitance of integration C of the integrator is momentarily closed by a LOGIC circuit at each transition of the INCR or DECR output signals of either one or the other comparator.

According to a fundamental aspect of the invention, the counter further comprises a TIMER that is started by a command IN produced by the LOGIC circuit. The TIMER measures the interval elapsing between the starting instant of a new ramp of integration and the switching of one or of the other comparator of the pair of comparators CompH and CompL of the sensing circuit.

An N bit nonvolatile memory REGISTER contains the information of the time interval integration of the amplifier's offset up to switching of one or the other of the two comparators, depending on the direction (sign) of the amplifier's offset, written therein during a trimming step. The so stored information includes a sign bit that identifies the direction of the offset of the monitoring amplifier. The asynchronous counter N that computes the charge and discharge interrupt signals, INCR and DECR, increments or decrements the computation, depending on the sign of the offset, at the elapsing of each interval of integration of the amplifier's offset, in function of the data permanently stored in the REGISTER.

A trimming step is commanded by the TEST_MODE command, which also controls the short-circuiting of the inputs of the differential amplifier (AMP) in order to check the offset. In practice, depending on the offset data (magnitude and sign) of the differential amplifier determined during a trimming step, permanently stored in the REGISTER upon the completion of the trimming step, at the end of a time interval equivalent to the time of integration of the amplifier offset determined during the trimming step, the information currently contained in the asynchronous counter N is decremented or incremented by a unit, depending on the stored offset sign.

That which is claimed is:

1. A charge counter for monitoring the charge and discharge current of a battery of an electronic device, the charge counter comprising:

a battery current sensing resistor;

a differential amplifier having inputs coupled to terminals of the battery current sensing resistor;

a resettable integrator of an output signal of the differential amplifier, and including a capacitor;

a first comparator of the output signal of the integrator for generating a logic charge interrupt signal;

a second comparator of the output signal of the integrator for generating a logic discharge interrupt signal;

a logic circuit for receiving the logic charge interrupt signal and the logic discharge interrupt signal;

a switch, which is momentarily closed by the logic circuit at every transition of the logic charge interrupt signal and the logic discharge interrupt signal, for discharging the capacitor of the integrator;

a processor for receiving the logic charge interrupt signal and the logic discharge interrupt signal to monitor the state of charge of the battery;

a timer measuring the time elapsing from the start of a new integration ramp and the switching instant of either one of the first and second comparators; and a nonvolatile memory containing information corresponding to a time interval integration of an offset of the differential amplifier up to the switching instant of either one of the first and second comparators, the offset comprising a short-circuiting of the inputs of the differential amplifier during a trimming step and the information including a sign bit depending on which one of the first and second comparators was switched;

the processor incrementing or decrementing the computation of the logic charge interrupt signal and the logic discharge interrupt signal depending on the sign bit of the offset at an expiration of each time interval of integration of the offset stored in the memory.

2. A charge counter for monitoring the charge and discharge current of a battery of an electronic device, the charge counter comprising:

a battery current sensing resistor;

a differential amplifier connected to the battery current sensing resistor;

a resettable integrator for integrating an output signal of the differential amplifier, and including a capacitor;

a first comparator for comparing the output signal of the integrator with a first threshold to generate a logic charge interrupt signal;

a second comparator for comparing the output signal of the integrator with a second threshold to generate a logic discharge interrupt signal;

a logic circuit for receiving the logic charge interrupt signal and the logic discharge interrupt signal;

a switch connected to the capacitor of the integrator and controlled by the logic circuit to close at a transition of the logic charge interrupt signal and the logic discharge interrupt signal, for discharging the capacitor;

a timer measuring an elapsed time from a start of a new integration ramp and a switching instant of either one of the first and second comparators;

a nonvolatile memory for storing information regarding a time interval integration of an offset of the differential amplifier up to the switching instant of either one of the first and second comparators, the offset being a short-circuiting of the inputs of the differential amplifier during a trimming step and the information including a sign bit depending on which one of the first and second comparators switched; and a processor for receiving the logic charge interrupt signal and the logic discharge interrupt signal to monitor the state of charge of the battery, and for incrementing or decrementing the computation of the logic charge interrupt signal and the logic discharge interrupt signal depending on the sign bit stored in the memory.

3. A charge counter according to claim 2, wherein the processor increments or decrements the computation of the logic charge interrupt signal and the logic discharge interrupt signal depending on the sign bit of the offset at an expiration of each time interval integration of the offset.

4. A charge counter according to claim 2, wherein the processor comprises an asynchronous counter.

5. An electronic device comprising:
   a rechargeable battery;
   a display for displaying information corresponding to a charge of the battery; and
   a charge counter for monitoring the charge and discharge of the battery, the charge counter comprising
      a battery current sensing resistor,
      a differential amplifier connected to the battery current sensing resistor,
      a resettable integrator for integrating an output signal of the differential amplifier, and including a capacitor,
      a first comparator for comparing the output signal of the integrator with a first threshold to generate a logic charge interrupt signal,
      a second comparator for comparing the output signal of the integrator with a second threshold to generate a logic discharge interrupt signal,
      a logic circuit for receiving the logic charge interrupt signal and the logic discharge interrupt signal,
      a switch connected to the capacitor of the integrator and controlled by the logic circuit to close at a transition of the logic charge interrupt signal and the logic discharge interrupt signal, for discharging the capacitor,
      a timer measuring an elapsed time from a start of a new integration ramp and a switching instant of either one of the first and second comparators,
      a nonvolatile memory for storing information regarding a time interval integration of an offset of the differential amplifier up to the switching instant of either one of the first and second comparators, the offset being a short-circuiting of the inputs of the differential amplifier during a trimming step and the information including a sign bit depending on which one of the first and second comparators switched, and
      a processor for receiving the logic charge interrupt signal and the logic discharge interrupt signal to monitor the state of charge of the battery, and for incrementing or decrementing the computation of the logic charge interrupt signal and the logic discharge interrupt signal depending on the sign bit stored in the memory.

6. An electronic device according to claim 5, wherein the processor increments or decrements the computation of the logic charge interrupt signal and the logic discharge interrupt signal depending on the sign bit of the offset at an expiration of each time interval integration of the offset.

7. An electronic device according to claim 5, wherein the processor comprises an asynchronous counter.

8. A method for monitoring the charge and discharge current of a battery of an electronic device, the method comprising the steps of:
   providing a battery current sensing resistor;
   providing a differential amplifier connected to the battery current sensing resistor;
   integrating an output signal of the differential amplifier with a resettable integrator including a capacitor;
   comparing an integrated output signal with a first threshold to generate a logic charge interrupt signal;
   comparing the integrated output signal with a second threshold to generate a logic discharge interrupt signal;
   detecting a transition of the logic charge interrupt signal and the logic discharge interrupt signal;
   discharging the capacitor at the transition of the logic charge interrupt signal and the logic discharge interrupt signal;
   measuring an elapsed time from a start of a new integration ramp and a switching instant of either one of the first and second comparators;
   storing information regarding a time interval integration of an offset of the differential amplifier up to the switching instant of either one of the first and second comparators, the offset being a short-circuiting of the inputs of the differential amplifier during a trimming step and the information including a sign bit depending on which one of the first and second comparators switched; and
   incrementing or decrementing the logic charge interrupt signal and the logic discharge interrupt signal depending on the stored sign bit.

9. A method according to claim 8, wherein the logic charge interrupt signal and the logic discharge interrupt signal are incremented or decremented depending on the sign bit of the offset at an expiration of each time interval integration of the offset.

10. A method according to claim 8, wherein the logic charge interrupt signal and the logic discharge interrupt signal are incremented or decremented with an asynchronous counter.

* * * * *